United States Patent
Gudel

(10) Patent No.: US 6,548,998 B1
(45) Date of Patent: Apr. 15, 2003

(54) ELECTRIC CURRENT SENSOR WITH WIDE PASSBAND

(75) Inventor: Claude Gudel, Le Pas de l'Echelle (FR)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 0 days.

(21) Appl. No.: 09/700,400
(22) PCT Filed: Jun. 4, 1999
(86) PCT No.: PCT/CH99/00247
§ 371 (c)(1),
(2), (4) Date: Nov. 14, 2000
(87) PCT Pub. No.: WO99/64874
PCT Pub. Date: Dec. 16, 1999

(30) Foreign Application Priority Data

Jun. 5, 1998 (CH) .............................................. 1225/98

(51) Int. Cl.$^7$ ............................................. G01R 33/00
(52) U.S. Cl. .................................................. 324/117 H
(58) Field of Search ................................. 324/127, 130, 324/117 R, 117 H, 251, 252; 338/32 H; 307/309

(56) References Cited

U.S. PATENT DOCUMENTS 3,573,616 A * 4/1971 Kahen .......................... 324/117
4,278,940 A * 7/1981 Milkovic ...................... 324/127
5,493,211 A * 2/1996 Baker ........................... 324/130

FOREIGN PATENT DOCUMENTS

EP  0670502 A1  9/1995

* cited by examiner

Primary Examiner—N. Le
Assistant Examiner—Etienne P LeRoux
(74) Attorney, Agent, or Firm—Clifford W. Browning; Woodard, Emhardt, Naughton, Moriarty & McNett

(57) ABSTRACT

The invention concerns a sensor including a magnetic circuit coupled with a primary conductor, a secondary winding coupled with the magnetic circuit, a damping resistor, a magnetic field detector arranged in an air gap of the magnetic circuit and a powering device supplying the secondary winding with a current tending to compensate the magnetic field in the air gap. A measuring resistor is connected in series to the secondary winding and an auxiliary resistor of same value as the damping resistor is connected to the secondary winding and the measuring resistor common connection point. A difference amplifier set is arranged for measuring the voltage at the secondary winding terminals and applying, to the auxiliary resistor, a voltage equal and in opposite direction to the one occurring at the secondary winding terminals.

1 Claim, 1 Drawing Sheet

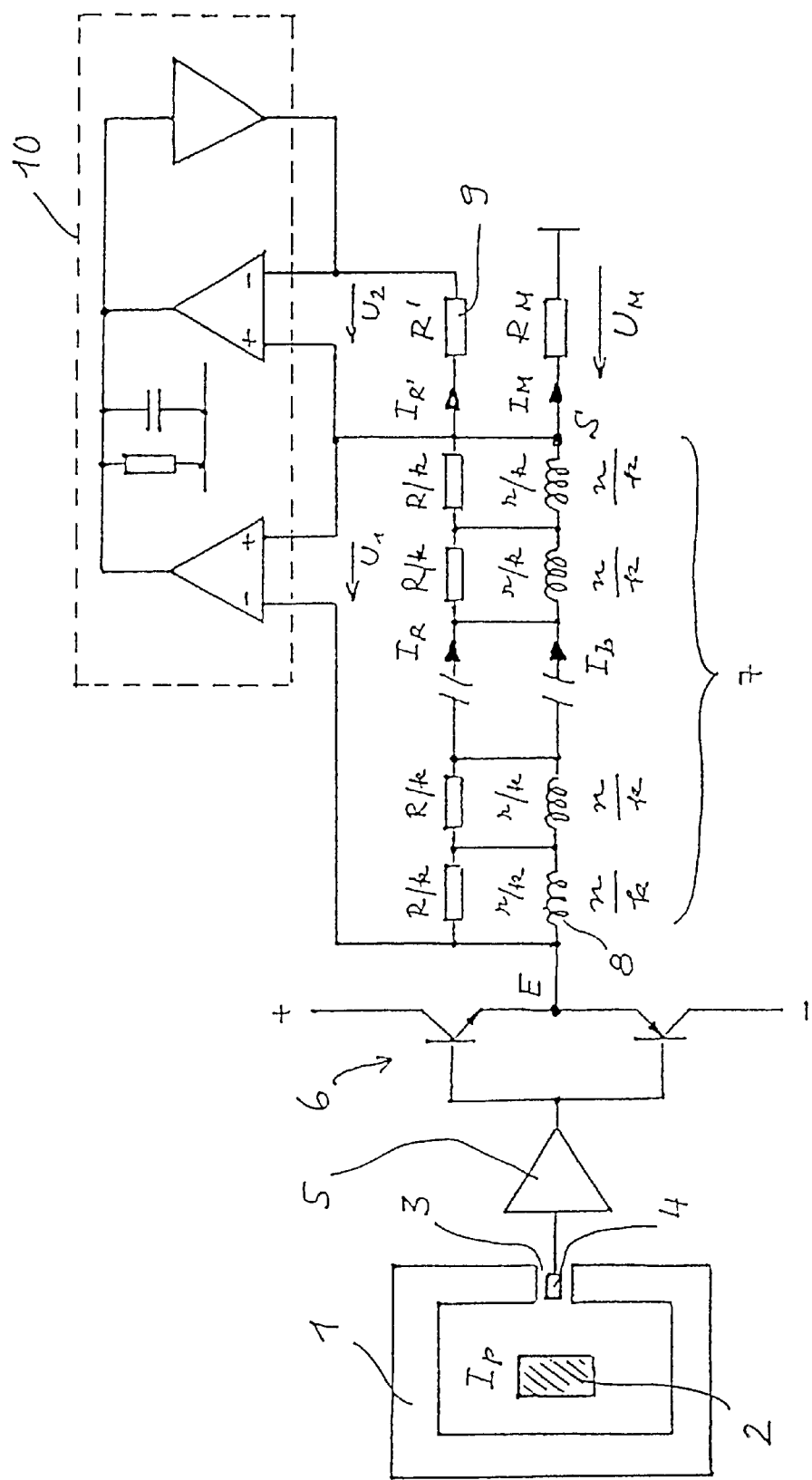

ELECTRIC CURRENT SENSOR WITH WIDE PASSBAND

BACKGROUND OF THE INVENTION

The present invention concerns an electric current sensor for measuring a current flowing through a primary conductor, this sensor comprising a magnetic circuit arranged to be coupled with said primary conductor, a secondary winding coupled with this magnetic circuit, a damping resistance of said winding, a magnetic field detector arranged within an air gap of said magnetic circuit, a current supply device for said secondary winding, where this current supply device is controlled by the magnetic field detector so as to feed to the secondary winding a compensating current which tends to compensate the magnetic field created in the air gap by the primary current, and a measuring resistor connected in series with the secondary winding where the voltage drop across this resistor forms the measuring signal of the sensor.

In sensors of this type the damping resistance associated with the secondary winding will influence the result of the measurement depending on the frequency range in which the current to be measured and its harmonic components are situated. In fact, in the low-frequency range, that is, from direct current up to a transition frequency, the sensor works in a compensating mode where a compensating current is injected into the secondary winding so as to compensate by the magnetic field created by this compensating current, the magnetic field induced by the primary current in the air gap of the magnetic circuit. The current flowing in the measuring resistor thus has a component due to the presence of the damping resistance of the secondary winding which adds to the compensating current in the strict sense, that is, to the component which, if there was no internal resistance of the winding, would suffice to compensate the magnetic field induced by the primary current. Thus, the measurement exhibits a positive error in the low-frequency range.

To the contrary, in the range of frequencies higher than the aforementioned transition frequency and up to a high cut-off frequency, the sensor will work as a current transformer. In this case the current flowing in the measuring resistor is lower than the exact value of the primary current, because of the damping resistance present in the secondary winding, so that the measurement is affected by a negative error.

SUMMARY OF THE INVENTION

The present invention has the particular aim of correcting the measuring error caused by the ohmic resistance of the secondary winding and by the damping resistance of this winding in both of the cases mentioned above, that is, over the entire bandwidth of the current sensor.

To this end the sensor according to the invention is characterized by the fact that it comprises an auxiliary resistor which has the same value of resistance as the damping resistance of the secondary winding and is connected to the common branch point of the secondary winding and the measuring resistor, and a differential amplifier block arranged so as to measure the voltage appearing at the terminals et the secondary winding and to apply to said auxiliary resistor a voltage of the same size but opposite in direction to that appearing at the terminals of the secondary winding.

BRIEF DESCRIPTION OF THE DRAWINGS

Other aspects, objectives and advantages of the invention will appear from the following description of an embodiment illustrated with the appended drawing where:

The FIGURE is an electric circuit diagram of a current sensor according to the invention.

DETAILED DESCRIPTION OF THE INVENTION

The FIGURE schematically shows a magnetic circuit 1 inside of which there is a primary conductor 2 shown in cross section, this conductor being traversed by a primary current $I_p$, to be measured. The magnetic circuit 1 exhibits an air gap 3 within which a magnetic field detector is arranged, for instance a Hall effect element 4. The output signal of detector 4 is applied to an amplifier 5 whose output controls a power stage 6. The output terminal E of this stage 6 is connected to a first terminal of a secondary winding 7 which is represented by its equivalent circuit, while the second terminal S of this winding is connected to a grounded measuring resistor RM.

The secondary winding 7 formed by n turns arranged on the magnetic circuit 1 is represented by a series of k groups of turns, for instance 8, each having n/k turns wit an internal resistance r/k, as well as a damping resistance represented by a resistance R/k connected in parallel wit each group of n/k turns. The damping resistance to the entire secondary winding thus is R.

The measuring current $I_M$ passing the measuring resistor $R_M$ and allowing the measuring voltage $U_M$ to be recovered at the terminals of this resistor should be $I_p/n$ when damping resistances are absent.

Since the damping resistance R is present at the terminals of the secondary winding, the current flowing through this secondary winding has actually two components, viz., the compensating current $'I_b$ properly speaking, and a damping current $I_R$. It follows that in the absence of the arrangement according to the invention, the measuring current $I_M$ is given by $I_M=I_B+I_R$ in the low-frequency range and by $I_M=I_B-I_R$ in the high-frequency range.

According to the invention, an auxiliary resistor 9 with a value of R'=R is connected to the terminal S, and according to the circuit of The FIGURE, a differential amplifier block 10 is also connected to terminal S via a common connection et the two positive inputs, and to the second terminal E of the winding 7 as well as to the second terminal et the auxiliary resistor 9 by corresponding negative inputs. The block 10 is arranged so as to measure the voltage $U_1$ appearing at the terminals of the secondary winding 7, and to create a voltage $U_2$ which is equal to $U_1$ at the terminals of the resistor 9. Under these conditions a current $I_{R'}=I_R$ flows through the resistor 9, and whatever the mode of functioning, one has $I_M=I_b$. Thus, the damping current which is due to the ohmic resistance of the secondary winding and to its damping resistances no longer interferes with the measurements anywhere within the bandwith of the current sensor.

What is claimed is:

1. Electric current sensor for measuring a current flowing through a primary conductor, this sensor comprising:

a magnetic circuit arranged to be coupled with said primary conductor, a secondary winding electromagnetically coupled with this magnetic circuit, each extremity of said secondary winding comprising a terminal, a damping resistance of said secondary winding, having a determined value and being connected between said terminals, a magnetic field detector arranged within an air gap of said magnetic circuit, a current supply device, controlled by the magnetic field detector and connected to a first terminal of said secondary winding so as to feed to the secondary winding a compensating current seeking to eliminate the magnetic field created in the air gap by the current flowing in the primary conductor, and a measuring resistor connected in series with the secondary winding, between the second terminal of said secondary winding and the ground, where the voltage drop across this resistors forms the measuring signal of the sensor, wherein the sensor further comprises:

an auxiliary resistor which has the same value of resistance as the ohmic damping resistance of the secondary winding, having one extremity connected to said second terminal and another extremity connected to a differential amplifier said differential amplifier block arranged so as to measure the voltage appearing at the terminals of the secondary winding and to apply to said other extremity of said auxiliary resistor a voltage of the same size but opposite in direction to that appearing at the terminals of the secondary winding.

* * * * *